(12) United States Patent
Russ et al.

(10) Patent No.: US 8,315,024 B2
(45) Date of Patent: Nov. 20, 2012

(54) ELECTROSTATIC DISCHARGE PROTECTION CIRCUIT, INTEGRATED CIRCUIT AND METHOD OF PROTECTING CIRCUITRY FROM AN ELECTROSTATIC DISCHARGE VOLTAGE

(75) Inventors: Christian Russ, Diedorf (DE);
Wolfgang Soldner, Unterhaching (DE);
Gernot Langguth, Oberhaching (DE);
David Alvarez, Munich (DE); Krysztof Domanski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 12/560,475

(22) Filed: Sep. 16, 2009

(65) Prior Publication Data

US 2011/0063763 A1 Mar. 17, 2011

(51) Int. Cl.
*H02H 3/22* (2006.01)
(52) U.S. Cl. .......................................... 361/56; 361/111
(58) Field of Classification Search .................... 361/56, 361/111
See application file for complete search history.

(56) References Cited

U.S. PATENT DOCUMENTS

| | | | |
|---|---|---|---|
| 5,500,546 A | | 3/1996 | Marum et al. |
| 6,351,362 B1 * | | 2/2002 | Inoue et al. ............ 361/111 |
| 7,087,938 B2 | | 8/2006 | Streibl et al. |
| 7,233,475 B1 * | | 6/2007 | Chen ...................... 361/111 |
| 7,656,627 B2 * | | 2/2010 | Ker et al. .................. 361/56 |
| 7,719,813 B2 * | | 5/2010 | Chen ...................... 361/111 |
| 2007/0201175 A1 | | 8/2007 | Arai et al. |
| 2008/0062597 A1 | | 3/2008 | Chen et al. |
| 2008/0128816 A1 | | 6/2008 | Lai |
| 2008/0158749 A1 | | 7/2008 | Kwak et al. |
| 2010/0053827 A1 * | | 3/2010 | Kawano .................. 361/56 |

OTHER PUBLICATIONS

Charvaka Duvvury, Warren Anderson; Design and Layout Requirements; ESD in Silicon Integrated Circuits, 2nd Edition; 2002; pp. 126-187; John Wiley & Sons, Ltd. ISBNs: 0-471-49871-8 (Hardback).

Michael Chaine; James Davis; Al Kearney; TLP Analysis of 0.125 um CMOS ESD Input Protection Circuit; 2003 EOS/ESD Symposium.

* cited by examiner

*Primary Examiner* — Danny Nguyen

(74) *Attorney, Agent, or Firm* — Infineon Techn. AG Patent Department

(57) ABSTRACT

Implementations are presented herein that include an electrostatic discharge (ESD) protection circuit. The ESD protection circuit includes a first transistor and a second transistor. The first transistor has a first terminal that is coupled to a first supply line and a bulk that is coupled to a second supply line. The second transistor has a first terminal that is coupled to the second supply line, a bulk that is coupled to the first supply line and a second terminal that is coupled to a second terminal of the first transistor to define a protected node. The ESD protection circuit further includes a current limiting element that has a first terminal that is coupled to the protected node.

16 Claims, 12 Drawing Sheets

US 8,315,024 B2

ELECTROSTATIC DISCHARGE PROTECTION CIRCUIT, INTEGRATED CIRCUIT AND METHOD OF PROTECTING CIRCUITRY FROM AN ELECTROSTATIC DISCHARGE VOLTAGE

BACKGROUND

Electrostatic discharge (ESD) protection design is a major factor in the reliability of deep-submicron CMOS Integrated Circuits (IC's). The device size and the thickness of the gate oxide of CMOS devices are being continually reduced to improve the operating speed of the CMOS devices and integration density of the IC's. These highly scaled-down devices, however, have been found to be increasingly vulnerable to ESD. Therefore, ESD protection circuits have been added into the CMOS IC's to protect the IC's against ESD damage. Typically, ESD protection circuits are implemented around the input, output and supply pads of the IC's to bypass ESD current away from the internal circuits of the IC's.

There are three main types of ESD events: Human Body Model (HBM), Machine Model (MM) and Charged Device Model (CDM). In the HBM and MM, respectively, the discharge current of the ESD event is from the outside of the IC into the inside of the IC, through the input or output or supply pins. Therefore, the ESD protection circuit is designed to shunt away the ESD current from the internal parts of the IC. In the CDM, the ESD voltage does not come from outside the IC, but rather from the IC itself. The substrate of the IC is assumed to be charged and then a pin of the IC is shorted to ground in a CDM ESD event. The CDM ESD current is discharged from the inside of the IC to the outside of the IC.

BRIEF DESCRIPTION OF THE DRAWINGS

The detailed description is described with reference to the accompanying figures. In the figures, the left-most digit of a reference number identifies the figure in which the reference number first appears. The use of similar reference numbers in different instances in the description and the figures may indicate similar or identical items.

DETAILED DESCRIPTION

Disclosed herein are techniques for protecting a circuit from ESD. According to one implementation, an ESD protection circuit includes a first transistor that has a first terminal coupled to a first supply line and a bulk coupled to a second supply line. The ESD protection circuit further includes a second transistor that has a first terminal coupled to the second supply line, a bulk coupled to the first supply line and a second terminal coupled to a second terminal of the first transistor to define a protected node. A current limiting element has a first terminal coupled to the protected node.

According to another implementation, an integrated circuit includes a current liming element and circuitry that is susceptible to damage due to an ESD event. The circuitry is coupled to a first supply line, a second supply line and a protected node, and the current limiting element has a first terminal that is coupled to the protected node. The integrated circuit further includes a protection circuit that is coupled to the first supply line, the second supply line and the protected node. The protection circuit includes at least two transistors that are configured to be resistant to breakdown during any electrostatic discharge event.

According to another embodiment, a method is provided for protecting circuitry from an ESD voltage. A current liming element is provided that has a first terminal coupled to a protected node and a second terminal coupled to an input/output node. Further, a protection circuit is provided that is coupled to a first supply line, a second supply line and the protected node. The protection circuit includes at least two transistors. At least one of the at least two transistors is operated in a MOS mode to discharge any ESD event at the input/output node.

In a conventional ESD protection circuit that includes a transistor as a protection element, during an ESD event, a potential between the source and drain of the transistor reaches a breakdown voltage and avalanche breakdown occurs. The trigger voltage of the transistor in the breakdown mode is too high to limit the voltage at a circuit to be protected below an oxide breakdown voltage. In the ESD protection circuits illustrated and described hereby, during an ESD event, the transistors of the ESD protection circuits may not enter the breakdown mode. Instead, they may operate in the MOS mode and may turn on fast and, at the same time, turn on at a low voltage.

The techniques described herein may be implemented in a number of ways. Examples and context are provided below with reference to the included figures and ongoing discussion.

Exemplar Devices and Methods

Figure 1:
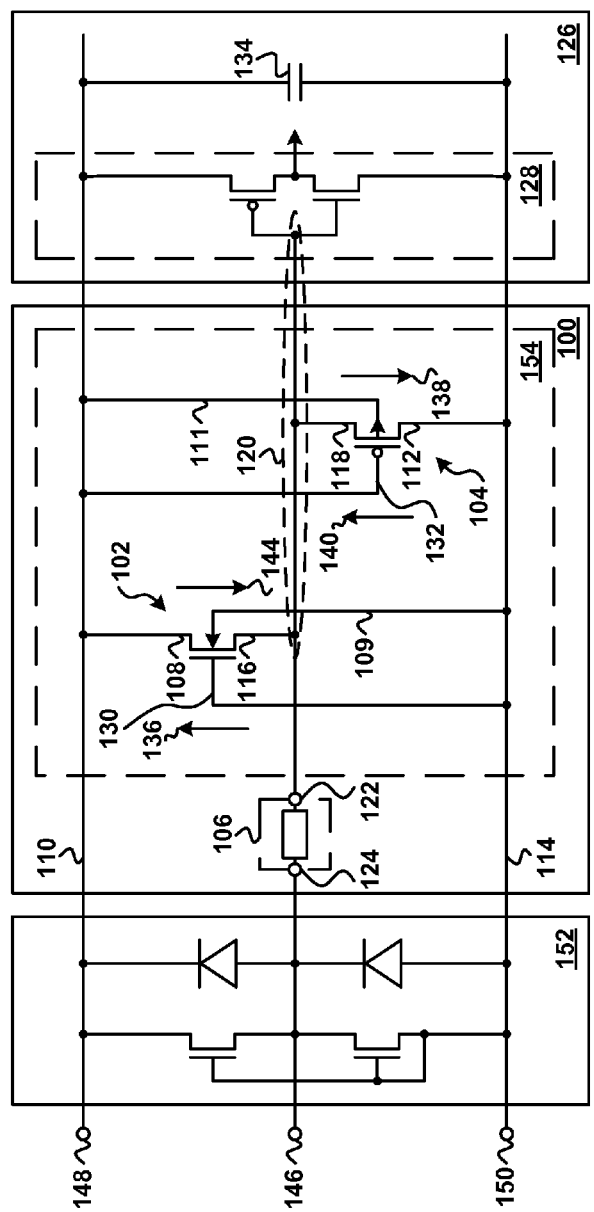
FIG. 1 shows an exemplary circuit arrangement that includes an ESD protection circuit with a first transistor, a second transistor and a current limiting element.

FIG. 1 shows an exemplary circuit arrangement that includes an electrostatic discharge (ESD) protection circuit 100 with a first transistor 102, a second transistor 104 and a current limiting element 106. A first terminal 108 of the first transistor 102 is coupled to a first supply line 110 and a bulk 109 of the first transistor 102 is coupled to a second supply line 114. A first terminal 112 of the second transistor 104 is coupled to the second supply line 114 and a bulk 111 of the second transistor 104 is coupled to the first supply line 110. As illustrated in FIG. 1, the first terminal 108 of the first transistor 102 may be directly coupled to the first supply line 110 and the first terminal 112 of the second transistor 104 may be directly coupled to the second supply line 114. A second terminal 116 of the first transistor 102 is coupled to a second terminal 118 of the second transistor 104 to define a protected node 120. Generally, the first transistor 102 and the second transistor 104 may be coupled in series between the first supply line 110 and the second supply line 114.

The current limiting element 106 has a first terminal 122 that is coupled to the protected node 120. A second terminal 124 of the current limiting element 106 may form an input terminal of the ESD protection circuit 100. As illustrated in FIG. 1, the current limiting element 106 may include a resistor that may reduce the current through the first transistor 102 and second transistor 104.

In one implementation, as illustrated in FIG. 1, the first transistor 102 may have a first conductivity type and the second transistor 104 may have a second conductivity type that is different from the first conductivity type. For example, the first transistor 102 may be an NMOS transistor and the second transistor 104 may be a PMOS transistor. A third terminal 130 of the NMOS transistor 102 may be a gate terminal that may be directly coupled to the second supply line 114. A third terminal 132 of the PMOS transistor 104 may be a gate terminal that may be directly coupled to the first supply line 110.

The protected node 120 may be coupled to a circuitry 126 that is susceptible to damage due to an ESD event. The circuitry 126 may be part of an integrated circuit (IC) and may perform certain functions and logic operations, respectively, of the IC. The circuitry 126 may include an input stage 128 that is coupled to the first supply line 110, the second supply line 114 and the protected node 120. The first supply line 110 may be a power supply line and the second supply line 114 may be a ground line. As illustrated in FIG. 1, the input stage 128 may be an inverter stage that is formed by two transistors connected in series. The ESD protection circuit 100 may protect the circuitry 126 from ESD damage by protecting the gate oxides of the transistors of the input stage 128 from failure due to ESD damage. The ESD protection circuit 100 and the circuitry 126 may be implemented on a single IC. In contrast to the circuitry 126, the ESD protection circuit 100 may not perform any logic operation. The purpose of the ESD protection circuit 100 may be dedicated to the ESD protection of the circuitry 126.

The input terminal 124 of the ESD protection circuit 100 may be coupled to an input/output- (I/O-) pad 146, the first supply line 110 may be coupled to a VDD-pad 148 and the second supply line 114 may be coupled to a VSS-pad 150. A signal that appears at the I/O-pad 146 may act as an input signal to the input stage 128.

During normal operation, i.e. when the IC is powered up with a supply voltage provided to the first supply line 110 and a ground potential provided to the second supply line 114, there may be no voltage at the input terminal 124 of the ESD protection circuit 100 or the voltage may be in the range of normal signal voltages. The ESD protection circuit 100 may be inactive and may not influence the operation of the circuitry 126.

Different ESD stress events may occur at the I/O-pad 146, the VDD-pad 148 and the VSS-pad 150. The operation of the ESD protection circuit 100 for the different ESD stress events will be described further herein.

In an ESD mode, called first ESD mode further herein, a positive ESD stress is applied between the input terminal 124 of the ESD protection circuit 100 and the second supply line 114 that is connected to a ground potential. In the first ESD mode, the ground potential is coupled to the gate terminal 132 of the PMOS transistor 104 via a coupling capacitance 134. The coupling capacitance 134 may be formed by a parasitic capacitance and/or a buffer capacitance of the circuitry 126. The PMOS transistor 104 turns on and operates in a MOS mode. The ESD event is dissipated through the PMOS transistor 104 operating in the MOS mode. An ESD discharge current flows from the source terminal 118 to the drain terminal 112 of the PMOS transistor 104 and to the ground potential of the ground line 114 as indicated by an arrow 138 in FIG. 1.

In a further ESD mode, called second ESD mode further herein, a negative ESD stress is applied between the input terminal 124 of the ESD protection circuit 100 and the second supply line 114 that is connected to a ground potential. In the second ESD mode, the gate terminal 132 of the PMOS transistor 104 is floating. However, during an ESD pulse the gate terminal 132 may have an elevated potential because of a capacitive coupling of the ESD pulse from the drain terminal 118 to the gate terminal 132 of the PMOS transistor 104 via the Miller capacitance. The gate terminal 132 of the PMOS transistor 104 is biased to a voltage that corresponds approximately to the threshold voltage of the PMOS transistor 104. The PMOS transistor turns on and operates in a MOS mode. An ESD discharge current flows from the source terminal 112 to the drain terminal 118 of the PMOS transistor 104 as indicated by an arrow 140 in FIG. 1. As the voltage at the gate terminal 132 corresponds approximately to the threshold voltage of the PMOS transistor 104, the ESD discharge current flowing through the PMOS transistor 104 is smaller than in the first ESD mode where the PMOS transistor 104 turns on fully. In other words, in the second ESD mode, the PMOS transistor 104 still turns on weakly and a weak ESD discharge current flows through PMOS transistor 104.

It is to be noted that in the second ESD mode, the source terminal and the drain terminal of the PMOS transistor 104 are swapped compared to the first ESD mode because of the different polarity of the ESD stress at the input terminal 124 of the ESD protection circuit 100 and at the second supply line 114.

In a further ESD mode, called third ESD mode further herein, a negative ESD stress is applied between the input terminal 124 of the ESD protection circuit 100 and the first supply line 110 that is connected to a ground potential. In this mode, similar to the first ESD mode, the ground potential is coupled to the gate terminal 130 of the NMOS transistor 102 via the coupling capacitance 134. The NMOS transistor 102 turns on fully and operates in MOS mode. An ESD discharge current flows from the drain terminal 108 to the source terminal 116 of the NMOS transistor 102 as indicated by an arrow 144 in FIG. 1.

In a further ESD mode, called fourth ESD mode further herein, a positive ESD stress is applied between the input terminal 124 of the ESD protection circuit 100 and the first supply line 110 that is connected to a ground potential. In this mode, similar to the second ESD mode, the gate terminal 130 of the NMOS transistor 102 is floating. During an ESD pulse the gate terminal 130 has an elevated potential because of a capacitive coupling of the ESD pulse from the drain terminal 116 to the gate terminal 130 of the NMOS transistor 102. The gate terminal 130 of the NMOS transistor 102 is biased to a voltage that corresponds approximately to the threshold voltage of the NMOS transistor 102. The NMOS transistor 102 turns on and operates in a weak MOS mode. An ESD discharge current flows from the drain terminal 116 to the source terminal 108 of the NMOS transistor 102 as indicated by an arrow 136 in FIG. 1.

In the fourth ESD mode, the drain terminal and the source terminal of the NMOS transistor 102 are swapped compared to the third ESD mode because of the different polarity of the ESD stress at the input terminal 124 of the ESD protection circuit 100 and at the first supply line 110.

In a further ESD mode, called fifth ESD mode further herein, a positively charged substrate, on which the ESD protection circuit 100 is implemented, is discharged via the input terminal 124 that is connected to a ground potential to initiate an ESD stress pulse. Similar to the second ESD mode, the PMOS transistor 104 operates in weak MOS mode and a weak ESD discharge current flows as indicated by the arrow 140. The NMOS transistor 102 operates similar as in the third ESD mode.

In a further ESD mode, called sixth ESD mode further herein, a negatively charged substrate is discharged via the input terminal 124 that is connected to a ground potential to initiate the ESD pulse. Similar to the first ESD mode, the PMOS transistor 104 turns on fully and operates in MOS mode. An ESD discharge current flows as indicated by the arrow 138. The NMOS transistor 102 operates similar as in the first ESD mode.

The fifth and sixth ESD modes are by their nature extremely fast and are characterized by high and dangerous peak currents. The transistors 102 and 104 may be designed to turn on very fast in these modes.

Generally, in every ESD mode, at least one of the transistors 102 and 104 of the ESD protection circuit 100 may operate in a MOS mode and no avalanche breakdown may occur at the transistors 102 and 104. The transistors 102 and 104 may be resistant to breakdown mode during any ESD event, that is, the transistors 102 and 104 may not enter breakdown mode or parasitic bipolar mode. In a MOS mode, the transistors 102 and 104 may turn on fast and at a low voltage, thereby protecting transistors of the circuitry 126 from a damaging voltage. Even transistors with thin gate oxides may be protected reliably from breakdown by the ESD protection circuit 100.

As the bulk 109 of the NMOS transistor 102 is coupled to the second supply line 114 and as the bulk 111 of the PMOS transistor 104 is coupled to the first supply line 110, the bulks of the transistors 102 and 104 may be biased during an ESD event such that the discharge of the ESD current may be enhanced by the MOS body effect. Due to the MOS body effect, a threshold voltage of at least one of the transistors 102 and 104 may be reduced in at least some of the ESD modes described above, i.e., when current flows as indicated by arrows 140 and 136. The consequence of the reduced threshold voltage is an enhanced MOS drive current which is beneficial for voltage clamping during ESD. The discharge of the ESD current may yet be further enhanced by intrinsic reverse diodes that are fully enabled, that is, by a well diode and a substrate diode that are coupled to the first and second supply lines 110 and 114, respectively. For the sake of clarity, the intrinsic substrate and well diodes of the transistors 102 and 104 are not shown in FIG. 1.

Referring to FIG. 1, the ESD protection circuit 100 may be coupled to the input stage 128 of the circuitry 126. Additionally or alternatively, the ESD protection circuit 100 may be coupled to an output stage. The output stage may be a driver stage that is formed by two transistors connected in series and the ESD protection circuit 100 may protect the transistors of the driver stage from ESD damage.

As illustrated in FIG. 1, the ESD protection circuit 100 may be coupled to a primary ESD stage 152. The NMOS transistor 102 and the PMOS transistor 104 of the ESD protection circuit 100 may form a secondary ESD stage 154 that is coupled to the primary ESD stage 152 via the current limiting element 106. In this implementation, the circuitry 126 may be protected from ESD damage by a two stage protection scheme. On the one hand, the primary ESD stage 152 may have a greater ESD robustness to provide a main bypass for the ESD discharge current. On the other hand, protection devices of the primary ESD stage 152 may have a high trigger voltage and/or may turn on slowly, so that the secondary ESD stage 154 may be activated first to clamp the ESD voltage. Typically, the primary ESD stage 152 may discharge most of the ESD charge and the secondary ESD stage 154 may discharge the remainder of the charge. The current limiting element 106 may be coupled between the I/O-pad 146 and the protected node 120 such that the primary ESD stage 152 provides a lower impedance path for discharging most of the charge from an ESD event before reaching the secondary ESD stage 154.

The primary ESD stage 152 may include discrete diodes and gate grounded NMOS transistors, as illustrated in FIG. 1. In another implementation, the primary ESD stage 152 may be formed differently. In general, the secondary ESD stage 154 may support a discharge of an ESD current particularly in ESD modes, in which the voltage limitation of the primary ESD stage 152 is limited. In the configuration as illustrated and described in connection with FIG. 1, the secondary ESD stage 154 may support the primary ESD stage 152 particularly in the first ESD mode and in the third ESD mode. In these modes, the NMOS transistor 102 and the PMOS transistor 104 of the secondary ESD stage 154 may turn on fully whereas the devices of the primary ESD stage 102 may operate in reverse direction, i.e., in avalanche breakdown mode and/or parasitic bipolar mode.

Figure 2:
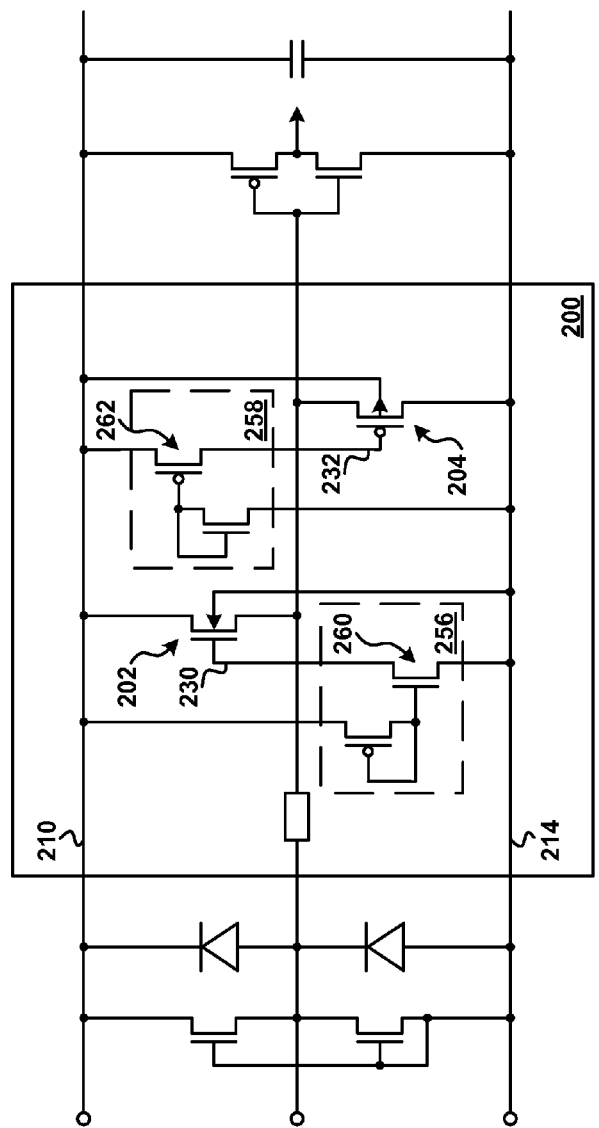
FIG. 2 shows a further exemplary circuit arrangement that includes an ESD protection circuit.

FIG. 2 shows a further exemplary circuit arrangement that includes an ESD protection circuit 200. As the ESD protection circuit 100 of FIG. 1, the ESD protection circuit 200 includes an NMOS clamping device 202 and a PMOS clamping device 204. In contrast to the implementation of FIG. 1, a gate terminal 230 of the NMOS transistor 202 is not directly coupled to the ground line 214 and a gate terminal 232 of the PMOS transistor 204 is not directly coupled to the power supply line 210. Instead, the gate terminals 230 and 232 of the protection transistors 202 and 204 are coupled to the power supply line 210 and the ground line 214 via tie cells 256 and 258.

The gate terminal 230 of the protection transistor 202 is coupled to the ground line 214 via the tie cell 256 that is called "tie-low cell" further herein. The tie-low cell 256 may maintain the gate terminal 230 of the NMOS transistor 202 at a voltage level of the ground line 214. The gate terminal 230 of the NMOS transistor 202 is not directly connected to the ground line 214 but an NMOS transistor 260 of the tie-low cell 256 is connected between the gate terminal 230 and the ground line 214, as illustrated in FIG. 1.

The gate terminal 232 of the protection transistor 204 is coupled to the power supply line 210 via tie cell 258 that is called "tie-high cell" further herein. The tie-high cell 258 may maintain the gate terminal 232 of the PMOS transistor 204 at a voltage level of the power supply line 210. The gate terminal 232 of the PMOS transistor 204 is not directly connected to the power supply line 210 but a PMOS transistor 262 of the tie-high cell 258 is connected between the gate terminal 232 and the power supply line 210, as illustrated in FIG. 1.

Within the tie cells 256 and 258 of the implementation as illustrated and described in connection with FIG. 1, transistors 260 and 262 are coupled between the gate terminals 230 and 232 and the ground line 214 and the power supply line 210, respectively. In another implementation, the tie cells may have a different structure. For example, resistors may be coupled between the gate terminals 230 and 232 and the ground line 214 and the power supply line 210, respectively.

The tie-low cell 256 and the tie-high cell 258 may protect the gate oxides of the NMOS transistor 202 and the PMOS transistor 204 from an ESD voltage received from the power supply line 210 and the ground line 214. That is, the tie-high cell 256 and the tie-low cell 258 may provide a protection to the ESD protection circuit 200 against damage due to an ESD event occurring between the power supply line 210 and the ground line 214.

Figure 3:
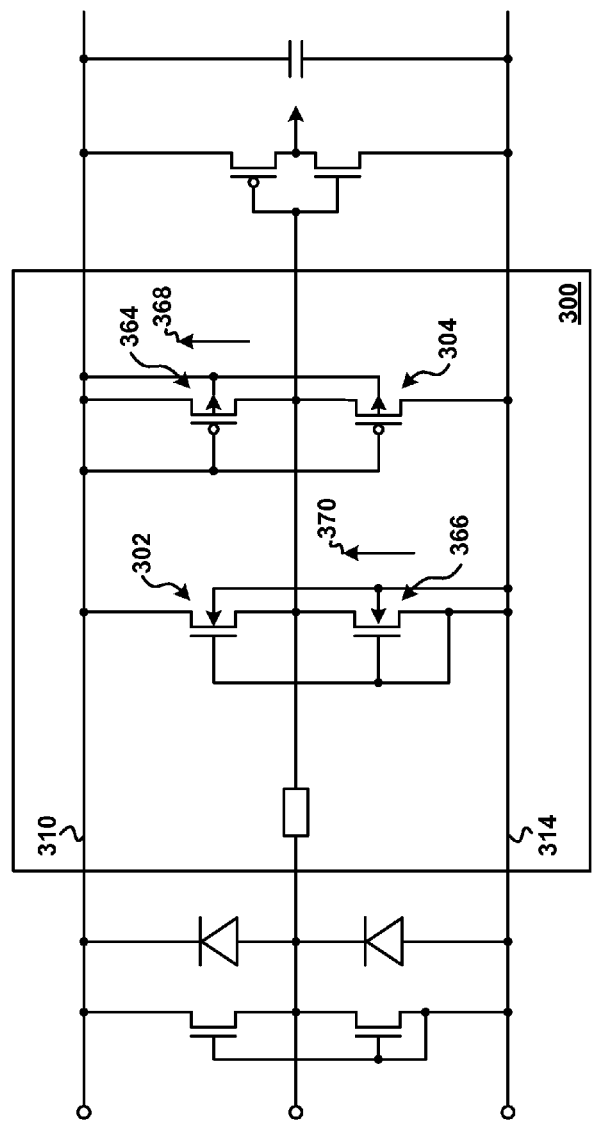
FIG. 3 shows an exemplary circuit arrangement that includes an ESD protection circuit with further transistors.

FIG. 3 shows a further exemplary circuit arrangement that includes an ESD protection circuit 300. The ESD protection circuit 300 includes an NMOS transistor 302 and a PMOS transistor 304 similar to the implementation as illustrated and described in connection with FIG. 1. The ESD protection circuit 300 further includes a further PMOS transistor 364 and a further NMOS transistor 366. The gate terminal of the further PMOS transistor 364 is coupled to the first supply voltage 310 and the gate terminal of the further NMOS transistor 366 is coupled to the second supply voltage 314. Each of the further PMOS transistor 364 and the further NMOS transistor 366 is connected in a MOS-diode configuration.

The further PMOS transistor 364 and the further NMOS transistor 366 may support the NMOS transistor 302 and the PMOS transistor 304 during a discharge of an ESD event. For example, in the fourth ESD mode, the further PMOS transistor 364 may operate in a MOS diode mode and an ESD discharge current may flow as indicated by an arrow 368 in FIG. 3. In the second ESD mode, the further NMOS transistor 366 may operate in a MOS diode mode and an ESD discharge current may flow as indicated by an arrow 370 in FIG. 3. The further PMOS transistor 364 and the further NMOS transistor 366 may not enter an avalanche breakdown mode or parasitic bipolar mode during any ESD stress event. Generally, the further PMOS transistor 364 and the further NMOS transistor 366 may support the NMOS transistor 302 and the PMOS transistor 304 in ESD modes, in which the NMOS transistor 302 and the PMOS transistor 304 may operate in a weak MOS mode. In any ESD mode, the ESD protection circuit 300 may trigger at a low voltage and may discharge any ESD stress voltage fast.

The junction capacitance that may be added by the further PMOS transistor 364 and the further NMOS transistor 366 may be very small as the further PMOS transistor 364 and the further NMOS transistor 366 may share a common drain diffusion in their physical implementation.

Figure 4:
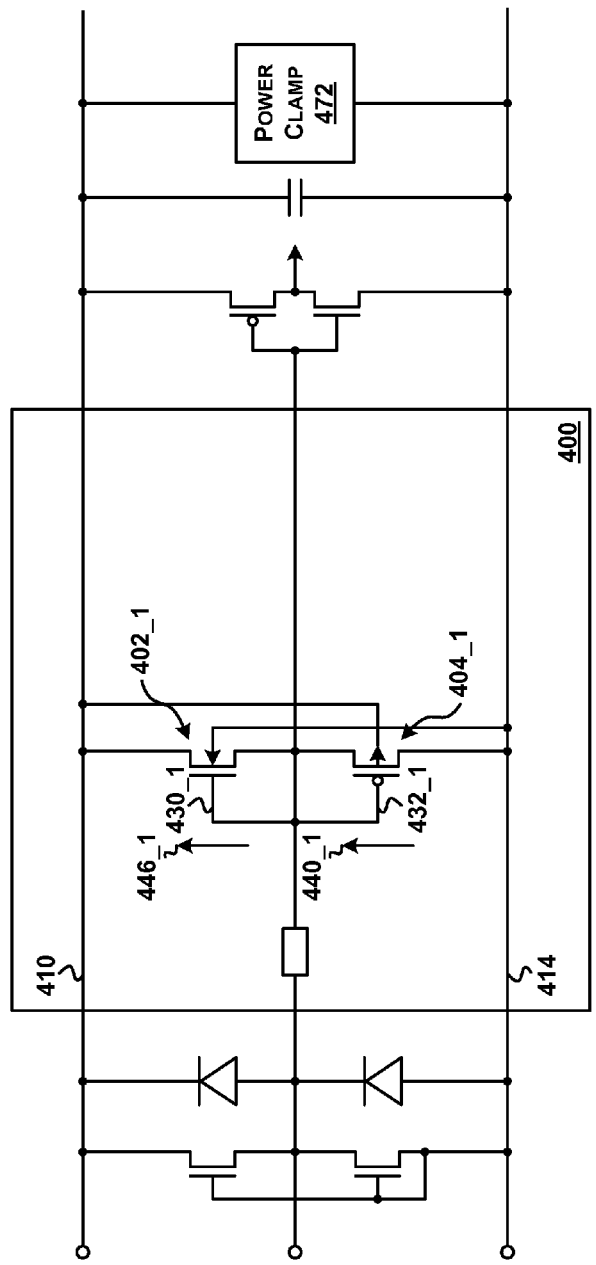
FIG. 4 shows an exemplary circuit arrangement that includes an ESD protection circuit and a power clamp.

FIG. 4 shows a further exemplary circuit arrangement that includes an ESD protection circuit 400 and a power clamp 472. Similar to the implementation as illustrated and described in connection with FIG. 1, the ESD protection circuit 400 includes an NMOS transistor 402_1 and a PMOS transistor 404_1. In contrast to the implementation of FIG. 1, a gate terminal 430_1 of the NMOS transistor 402_1 is coupled to a protected node 420 and a gate terminal 432_1 of the PMOS transistor 404_1 is coupled to the protected node 420. That is, both the NMOS transistor 402_1 and the PMOS transistor 404_1 are connected in a diode configuration.

The power clamp 472 is coupled between a first supply line 410 and a second supply line 414. During an ESD event across the supply lines 410 and 414, the power clamp 472 may provide a low resistance path and may discharge an ESD current. For example, the power clamp 472 may include an RC-timed MOS transistor or a silicon controller rectifier (SCR) and may include a reverse diode.

In the first and fourth ESD modes, an ESD event may discharge through the NMOS transistor 402_1 that may operate in a MOS diode mode, as indicated by an arrow 446_1 in FIG. 4. In the second and third ESD modes, an ESD event may discharge through the PMOS transistor 404_1 that may operate in the MOS diode mode, as indicated by an arrow 440_1 in FIG. 4. In the first and third ESD modes, the ESD event may also discharge through the power clamp 472. As the gate terminals 430_1 and 432_1 of the transistors 402_1 and 404_1 are connected to the protected node 420, the gate terminals 430_1 and 432_1 may be fully biased and turn on fast during any ESD stress. The transistors 402_1 and 404_1 may enter the MOS diode mode during any ESD stress event, that is, no avalanche breakdown and no parasitic bipolar action may occur.

Figure 5:
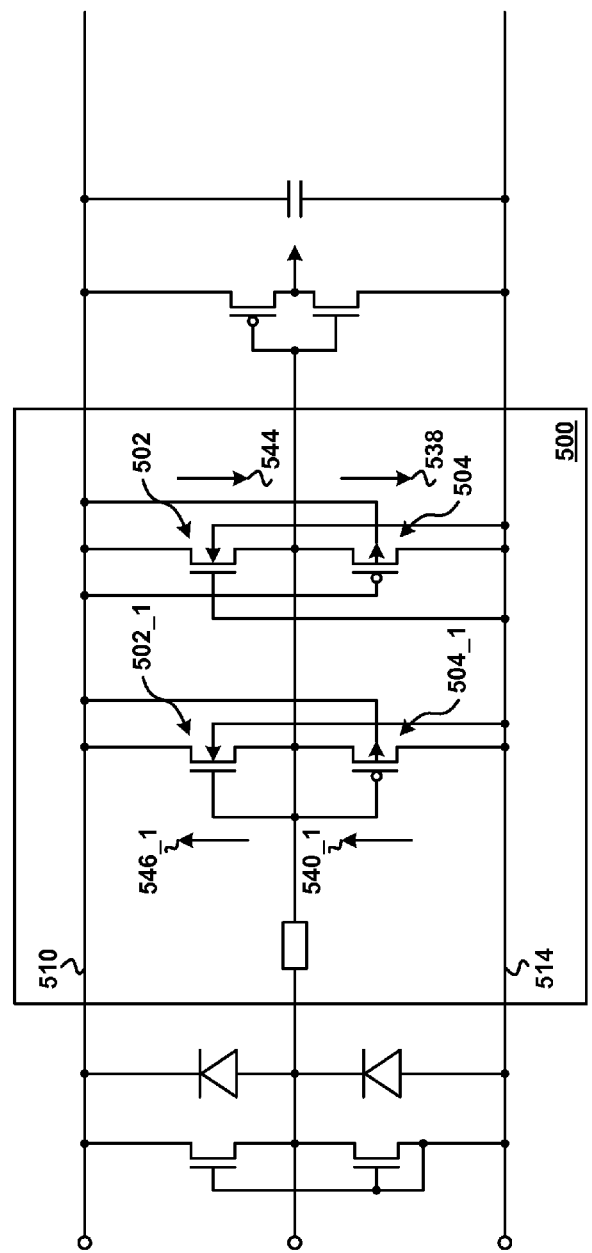
FIG. 5 shows an exemplary circuit arrangement that combines the exemplary circuit arrangement of FIG. 1 with the exemplary circuit arrangement of FIG. 4.

The implementation as illustrated and described in connection with FIG. 1 may be combined at least partly with the implementation as illustrated and described in connection with FIG. 4. FIG. 5 shows an exemplary circuit arrangement that includes such a combination. An ESD protection circuit 500 includes a first NMOS transistor 502 and a first PMOS transistor 504 similar to the implementation of FIG. 1. The ESD protection circuit 500 further includes a second NMOS transistor 502_1 and a second PMOS transistor 504_1 similar to the implementation of FIG. 4.

In the first and third ESD modes, the ESD current may mainly discharge through the first PMOS transistor 504 and the first NMOS transistor 502, respectively, that may operate in MOS mode, as indicated by arrows 538 and 544, respectively, and as described in connection with FIG. 1. In contrast to the circuit arrangement of FIG. 4, a power clamp that is coupled between the supply lines 510 and 514 may not be required to discharge the ESD current. As the first NMOS transistor 502 is directly coupled to the second supply line 514 and as the first PMOS transistor 504 is directly coupled to the first supply line 510, the transistors 502 and 504 may provide an improved voltage limitation at a low turn-on voltage in the first and third ESD modes, respectively. In the second and fourth ESD modes, the ESD stress may mainly discharge through the second NMOS transistor 502_1 and the second PMOS transistor 504_1, respectively, that may operate in MOS diode mode, as indicated by arrows 546_1 and 540_1, respectively, and as described in connection with FIG. 4.

In each of the ESD modes, at least one of the transistors 502, 502_1, 504 and 504_1 of the ESD protection circuit 500 may trigger fast and at a low voltage. Therefore, the ESD protection circuit 500 may safely discharge any ESD event so that no damage may result to a circuitry that is coupled to the ESD protection circuit 500.

Figure 6:
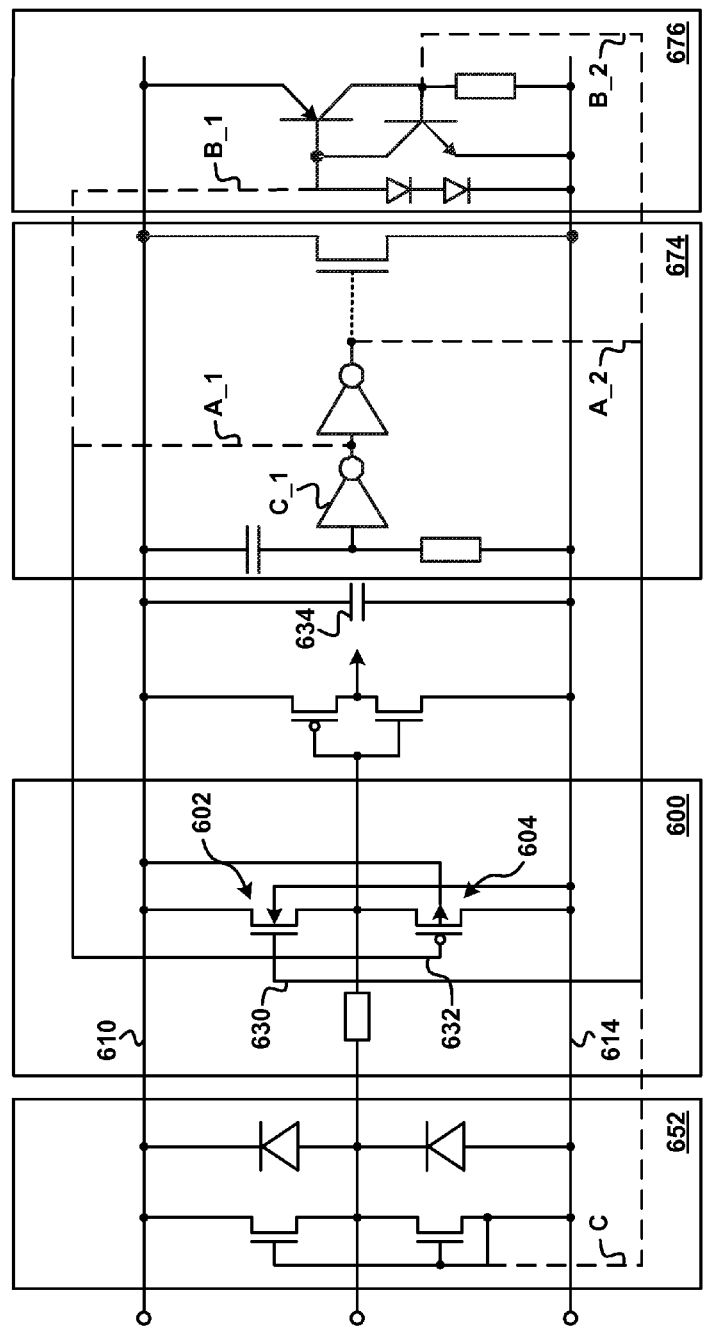
FIG. 6 shows an exemplary circuit arrangement that includes an ESD protection circuit, a first power clamp, a second power clamp and a primary ESD stage.

FIG. 6 shows a further exemplary circuit arrangement that includes an ESD protection circuit 600, a first power clamp 674, a second power clamp 676 and a primary ESD stage 652. As the ESD protection circuit 100 of FIG. 1, the ESD protection circuit 600 includes an NMOS transistor 602 and a PMOS transistor 604. In contrast to the implementation of FIG. 1, a gate terminal 630 of the NMOS transistor 602 is not coupled to the ground line 614 and a gate terminal 632 of the PMOS transistor 604 is not coupled to the power supply line 610. Instead, the gate terminals 630 and 632 may be coupled to the first power clamp 674, the second power clamp 676 or the primary ESD stage 652 and each of the gate terminals 630 and 632 may be coupled to a separate control line. In one implementation, the first power clamp 674 may include an RC-timed MOS transistor and the gate terminals 630 and 632 may be coupled to an inverter chain of the first power clamp 674, as shown by dashed lines A_1 and A_2. In another implementation, the second power clamp 676 may include an SCR or thyristor and the gate terminals 630 and 632 may be coupled to the SCR, as shown by dashed lines B_1 and B_2. In another implementation, the gate terminals 630 and 632 may be coupled to gate terminals of transistors of the primary ESD stage 652. By coupling the gate terminals 630 and 632 to internal signals of the first power clamp 674, the second power clamp 676 or the primary ESD stage 652, the gate terminals 630 and 632 of the transistors 602 and 604 may receive an active gate bias and an improved bias voltage during an ESD stress. For example, the gate terminal 632 of the PMOS transistor 604 may be pulled low to a potential of the ground line 612 by an output of an inverter C_1 and as determined by an RC constant of the first power clamp 674. The ESD protection circuit 600 may be used for implementations with a small parasitic capacitance 634 which provides only little capability to couple the power supply line 610 to the ground line 614. Therefore, at least one of the transistors 602 and 604 may turn on fast and at a low voltage as soon as an ESD event occurs.

Figure 7:
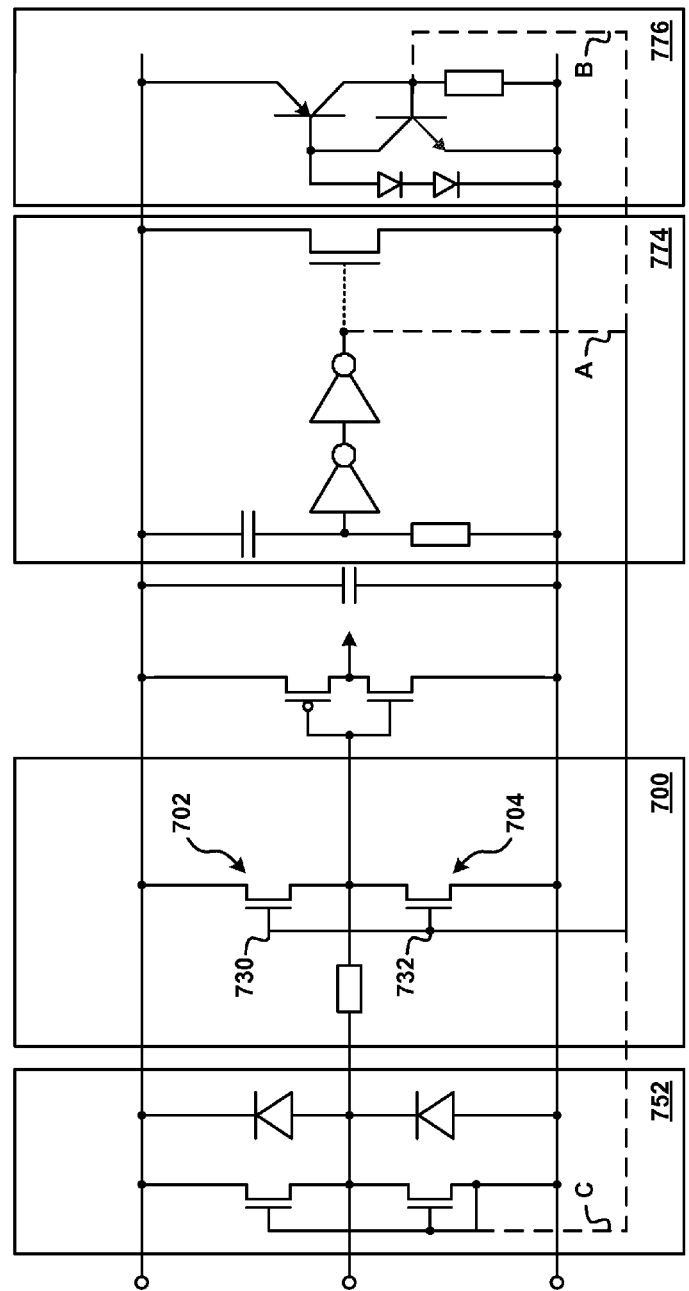
FIG. 7 shows a further exemplary circuit arrangement that includes an ESD protection circuit, a first power clamp, a second power clamp and a primary ESD stage.

FIG. 7 shows a further exemplary circuit arrangement that includes an ESD protection circuit 700, a first power clamp 774, a second power clamp 776 and a primary ESD stage 752. Similar to the circuit arrangement of FIG. 6, gate terminals 730 and 732 of transistors 702 and 704 of the ESD protection circuit 700 are coupled to internal signals of the first power clamp 774, the second power clamp 776 or the primary ESD stage 752. In contrast to the implementation of FIG. 6, the ESD protection circuit 700 includes a first transistor 702 and a second transistor 704 of a same conductivity type. As illustrated in FIG. 7, each of the transistors 702 and 704 may be an NMOS transistor and gate terminals 730 and 732 of the NMOS transistors 702 and 704 may be coupled to a common control line. The common control line may be coupled to an inverter line of the first power clamp 774 as indicated by a dashed line A, to a thyristor of the second power clamp 776 as indicated by a dashed line B or to gate terminals of transistors of the primary ESD stage 752.

It is to be noted that in the circuit arrangements of FIG. 6 and FIG. 7 at least one of the first power clamp 674 and 774 and the second power clamp 676 and 776 may be omitted.

Figure 8:
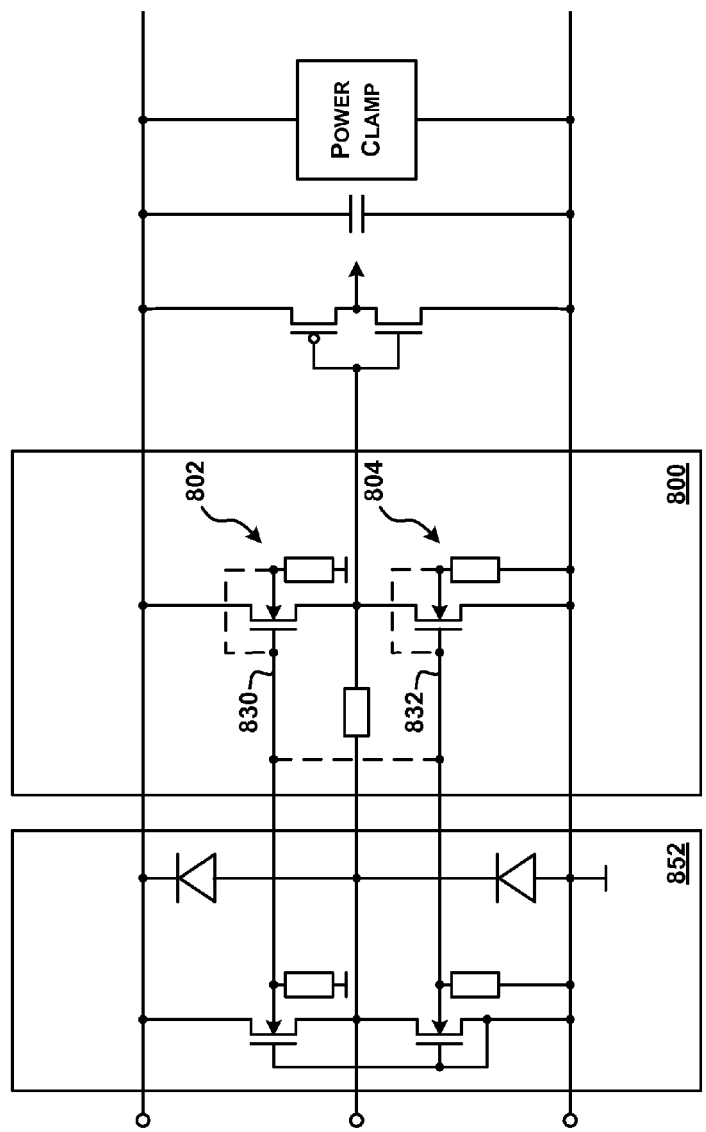
FIGS. 8-10 show further exemplary circuit arrangements that include an ESD protection circuit
Figure 9:
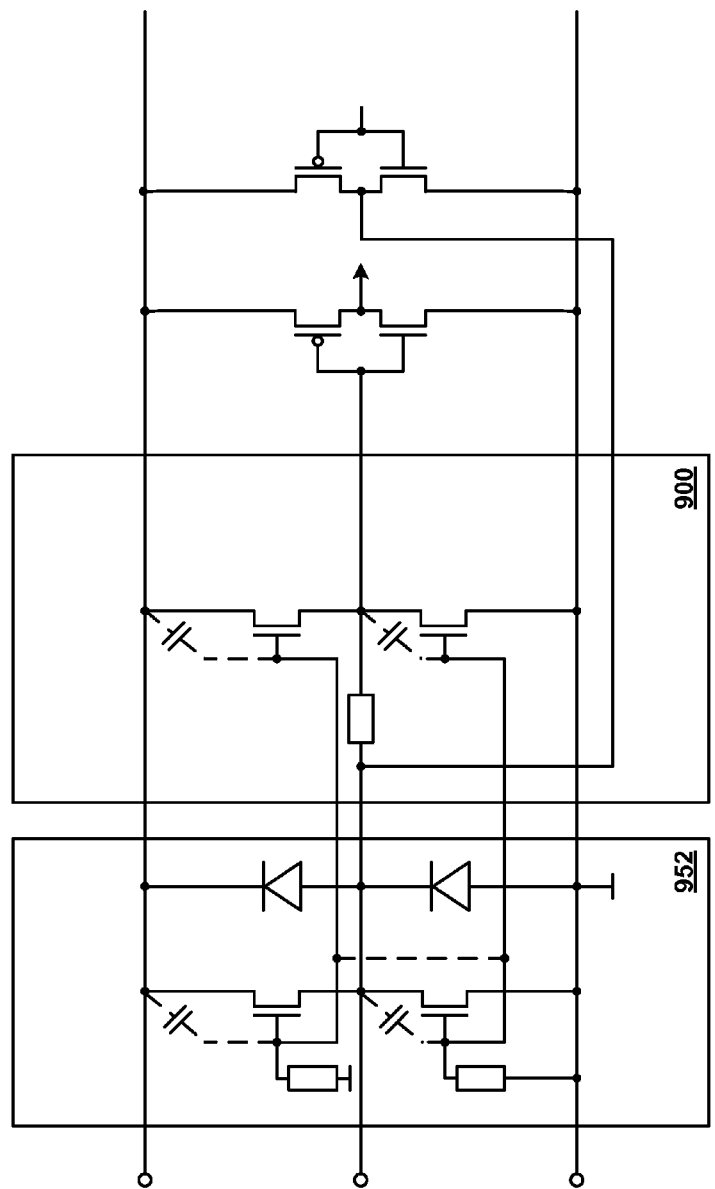
Figure 10:
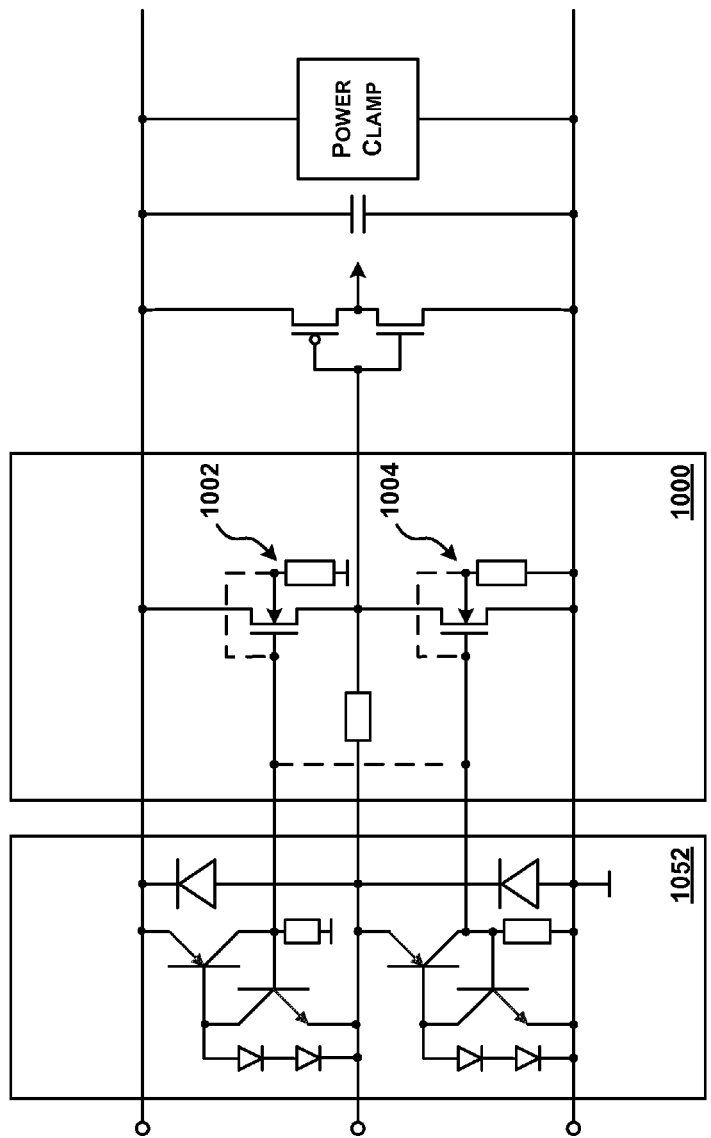

FIGS. 8-10 show further exemplary circuit arrangements that include an ESD protection circuit 800, 900 and 1000. Similar to the implementation of FIG. 7, each of the ESD protection circuits 800, 900 and 1000 includes two NMOS transistors. The gate terminals of the two NMOS transistors are coupled to a primary ESD stage 852, 952 and 1052. That is, the ESD protection circuits 800, 900 and 1000 are secondary ESD stages. In case of an ESD event, the primary ESD stages 852, 952 and 1052 may provide a gate control signal to the ESD protection circuits 800, 900 and 1000 upon triggering of the primary ESD stages 852, 952 and 1052. Each of the circuit arrangements of FIGS. 8-10 may form a simple implementation of an ESD protection circuit arrangement.

The dashed lines in FIGS. 8-10 show optional circuit connections. The resistors that are illustrated in FIGS. 8+10 are substrate resistors and the capacitors that are illustrated in FIG. 9 are gate-to-drain coupling capacitances that are shown for the sake of clarity.

In the implementation of FIG. 8, substrate contacts of MOS transistors of the primary ESD stage 852 are coupled to gate terminals 830 and 832 of the NMOS transistors 802 and 804 of the ESD protection circuit 800. Upon triggering of the primary ESD stage 852 by avalanche breakdown and/or parasitic bipolar action, the substrate potential of the triggered primary clamp device is increased. This substrate potential is used to turn on the NMOS devices 802 and 804 at a low voltage.

In the implementation of FIG. 9, gate terminals of MOS transistors of the primary ESD stage 952 are coupled to gate terminals 930 and 932 of the NMOS transistors 902 and 904 of the ESD protection circuit 900. The primary ESD stage 952 is RC-triggered and may provide a fast trigger signal to the ESD protection circuit 900 in case of an ESD event.

In the implementation of FIG. 10, gate terminals 1030 and 1032 of NMOS transistors 1002 and 1004 of the ESD protection circuit 1000 are coupled to local thyristor clamps of the primary ESD stage 1052. The thyristor clamps feature an increased substrate potential during triggering which is used to turn on the NMOS devices 1002 and 1004.

In the implementations as illustrated in FIGS. 1-10, the input terminal of the ESD protection circuit is coupled to an I/O-pad. Therefore, the ESD protection circuit may provide ESD protection to a circuitry that is coupled to the I/O-pad. In other words, the ESD protection circuit may provide ESD protection to a circuitry that is located at an interface of a chip to the external.

Figure 11:
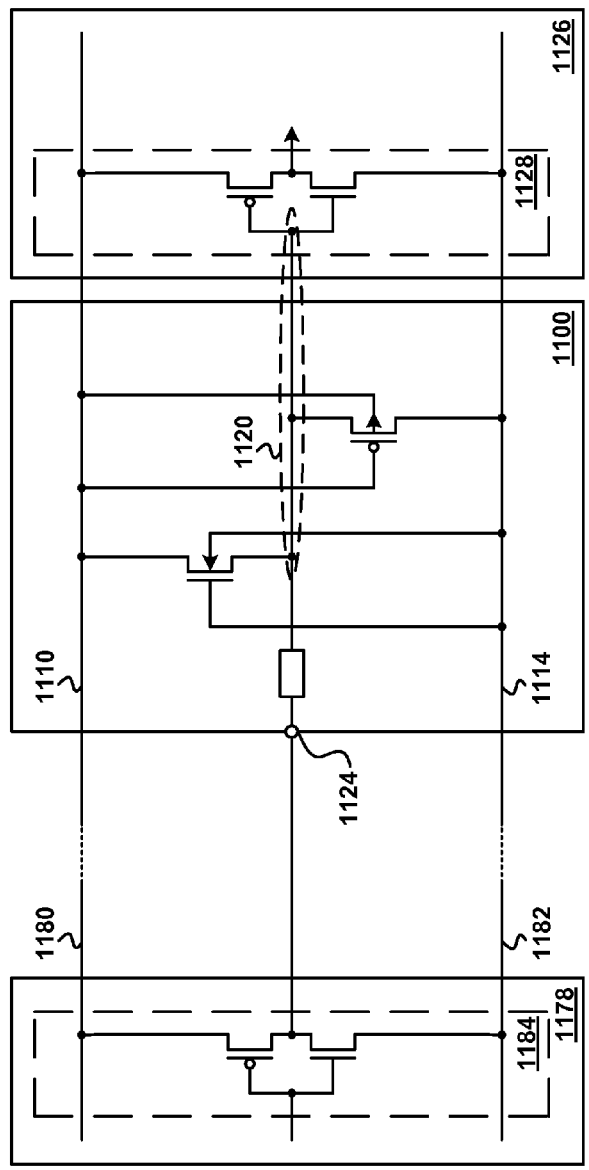
FIG. 11 shows an exemplary circuit arrangement that includes an ESD protection circuit, a first circuitry and a second circuitry.

In other implementations, an ESD protection circuit according to one of the implementations as illustrated and described in connection with FIGS. 1-10 may protect a chip-internal interface from ESD damage. FIG. 11 shows an exemplary circuit arrangement that includes an ESD protection circuit 1100, a first circuitry 1126 and a second circuitry 1178. The ESD protection circuit 1100, the first circuitry 1126 and the second circuitry 1178 may all be implemented on a single chip. The ESD protection circuit 1100 and the first circuitry 1126 may belong to a first power domain that is defined by a first supply line 1110 and a second supply line 1114. The second circuitry 1178 may belong to a second power domain that is defined by a third supply line 1180 and a fourth supply line 1182. The first supply line 1110 and the third supply line 1180 may be power supply lines and, during operation, a potential of the first supply line 1110 may differ from a potential of the third supply line 1180. The second supply line 1114 and the fourth supply line 1182 may be ground lines and, during operation, a potential of the third supply line 1180 may differ from a potential of the fourth supply line 1182. The potential of the first supply line 1110 and the third supply line 1180 and the potential of the second supply line 1114 and the fourth supply line 1182, respectively, may not differ more than approximately 0.5V in order to prevent malfunction of the circuit arrangement. As indicated by dotted lines in FIG. 11, the first supply line 1110 may not be directly coupled to the third supply line 1180 and the second supply line 1114 may not be directly coupled to the fourth supply line 1182. The implementation of the connection between the first supply line 1110 and the third supply line 1180 and the connection between the second supply line 1114 and the fourth supply line 1182 may be adapted to the requirements of the first circuitry 1126 and the second circuitry 1178.

An input terminal 1124 of the ESD protection circuit 1100 may be coupled to an output stage 1184 of the second circuitry 1178 and a protected node 1120 of the ESD protection circuit 1100 may be coupled to an input stage 1128 of the first circuitry 1126. That is, the ESD protection circuit 1100 may be coupled between the first circuitry 1126 and the second circuitry 1178. In other words, the ESD protection circuit 1100 may be located at a chip-internal interface between two power domains.

An ESD stress event may be induced by the second power domain and may endanger devices of the first power domain. The ESD protection circuit 1100 may protect devices of the first circuitry 1126, i.e., devices of the first power domain. For example, gate oxides of devices of the input stage 1128 may be protected by the ESD protection circuit 1100 from ESD damage. That means, the ESD protection circuit 1100 may protect devices of the first power domain from an ESD stress that originates from the second power domain. In other words, the ESD protection circuit 1100 may provide ESD protection within a chip at the boundary between two voltage domains.

The ESD protection circuit 1100 is similar to the ESD protection circuit 100 as illustrated and described in connection with FIG. 1. In other implementations, any of the ESD protection circuits as illustrated and described in connection with FIGS. 1-7 may provide an ESD protection at a chip-internal interface.

Figure 12:
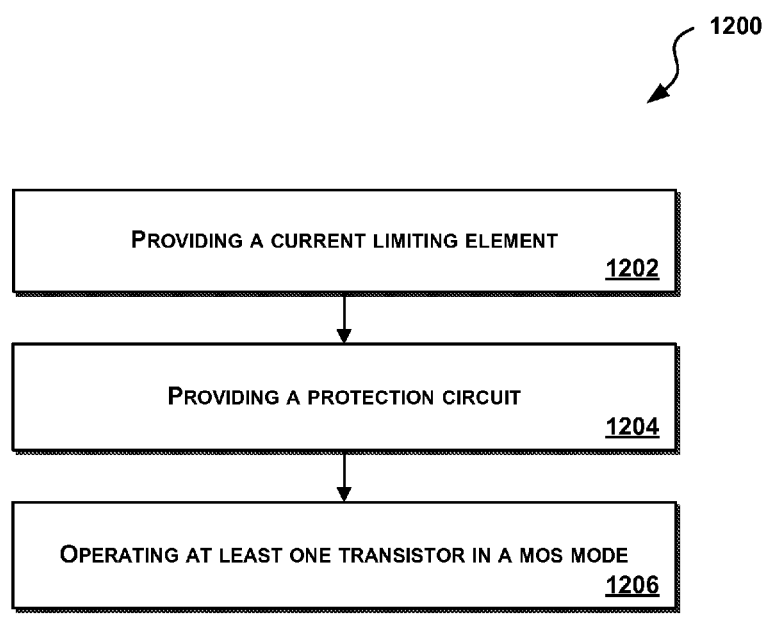
FIG. 12 illustrates a flow diagram that includes a number of operations protecting circuitry from an electrostatic discharge voltage.

FIG. 12 illustrates a flow diagram 1200 that includes a number of operations protecting circuitry from an electrostatic discharge voltage. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIGS. 1-11 and the subject matter thereof. The procedures described in connection with FIG. 12 may be realized utilizing the previously described implementations.

Referring to FIG. 12, at block 1202, a current limiting element having a first terminal coupled to a protected node and a second terminal coupled to an input/output node is provided. In one implementation, the current limiting element may be a resistor, as described in connection with FIG. 1.

At block 1204, a protection circuit that is coupled to a first supply line, a second supply line and the protected node is provided. The protection circuit includes at least two transistors. In one implementation, one of the at least two transistors may be an NMOS transistor and a first terminal of the NMOS transistor may be coupled to a power supply line. Another one of the at least two transistors may be a PMOS transistor and a first terminal of the PMOS transistor may be coupled to a ground line. A second terminal of the NMOS transistor may be coupled to a second terminal of the PMOS transistor to define the protected node. Generally, the protection circuit may be coupled between a power supply line and a ground line and it may include an NMOS transistor and a PMOS transistor that are connected in series.

At block 1206, at least one of the at least two transistors is operated in a MOS mode to discharge any ESD event at the input/output node. That means, independent of the kind of the ESD event at least one of the two transistors operates in a MOS mode to discharge energy from an ESD event of any polarity occurring at the input/output node. The transistors do not enter breakdown mode and/or parasitic bipolar mode to discharge the ESD event. The at least one of the two transistors may turn on fast and, at the same time, turn on at a low voltage to limit a voltage at the protected node.

In one implementation, the electrostatic discharge event may be a positive or negative electrostatic discharge voltage, the ground line may be connected to a ground potential and the PMOS transistor may operate in the MOS mode during the discharging act. In another implementation, the electrostatic discharge event may be a positive or negative electrostatic discharge voltage, the power supply line may be connected to a ground potential and the NMOS transistor may operate in the MOS mode during the discharging act.

Conclusion

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims. It is within the scope of this disclosure to combine various features of the different implementations and claims to produce variations thereof.

What is claimed is:

1. An electrostatic discharge protection circuit, comprising:
a first transistor having a first terminal coupled to a first supply line and a bulk coupled to a second supply line;
a second transistor having a first terminal coupled to the second supply line, a bulk coupled to the first supply line and a second terminal coupled to a second terminal of the first transistor to define a protected node;
a current limiting element having a first terminal coupled to the protected node; and a primary electrostatic discharge protection stage coupled to a second terminal of the current limiting element,
wherein a third terminal of the first transistor is coupled to the second supply line and wherein a third terminal of the second transistor is coupled to the first supply line, and
wherein the third terminal of the first transistor is directly coupled to the second supply line and wherein a third terminal of the second transistor is directly coupled to the first supply line.

2. The electrostatic discharge protection circuit of claim 1, wherein the first transistor has a first conductivity type and the second transistor has a second conductivity type that is different from the first conductivity type.

3. The electrostatic discharge protection circuit of claim 1, wherein the first supply line is a power supply line and wherein the second supply line is a ground line.

4. The electrostatic discharge protection circuit of claim 1, wherein the current liming element comprises a resistor.

5. The electrostatic discharge protection circuit of claim 1, wherein the third terminal of the first transistor is coupled to the second supply line via a first tie-cell and wherein a third terminal of the second transistor is coupled to the first supply line via a second tie-cell.

6. The electrostatic discharge protection circuit of claim 1, wherein a third terminal of first transistor is coupled to the protected node and wherein a third terminal of the second transistor is coupled to the protected node.

7. The electrostatic discharge protection circuit of claim 1, further comprising at least one power clamp device coupled between the first supply line and the second supply line, wherein a third terminal of the first transistor is coupled to the at least one power clamp device and wherein a third terminal of the second transistor is coupled to the at least one power clamp device.

8. The electrostatic discharge protection circuit of claim 7, wherein the at least one power clamp device is a silicon controlled rectifier power clamp or an RC-triggered power clamp.

9. An electrostatic discharge protection circuit, comprising:
a first transistor having a first terminal coupled to a first supply line and a bulk coupled to a second supply line;
a second transistor having a first terminal coupled to the second supply line, a bulk coupled to the first supply line and a second terminal coupled to a second terminal of the first transistor to define a protected node;

a current limiting element having a first terminal coupled to the protected node; and a primary electrostatic discharge protection stage coupled to a second terminal of the current limiting element, further comprising a third transistor having a first terminal coupled to the first supply line and a second terminal coupled to the protected node; and a fourth transistor having a first terminal coupled to the second supply line and a second terminal coupled to the protected node.

10. An integrated circuit, comprising:

circuitry coupled to a first supply line, a second supply line and a protected node, the circuitry being susceptible to damage due to an electrostatic discharge event;

a current limiting element having a first terminal coupled to the protected node;

a protection circuit coupled to the first supply line, the second supply line and the protected node, wherein the protection circuit comprises at least two transistors wherein the at least two transistors are configured to be resistant to breakdown during any electrostatic discharge event;

a primary electrostatic discharge protection stage coupled to a second terminal of the current liming element; and additional circuitry coupled to the second terminal of the current limiting element, wherein the additional circuitry is coupled to a third supply line and a fourth supply line, wherein during operation of the additional circuitry a voltage potential of the third and fourth supply line is different from a voltage potential of the first and second supply line.

11. The integrated circuit of claim 10, wherein the at least two transistors are configured to operate in MOS mode during an electrostatic discharge event.

12. The integrated circuit of claim 10, wherein the first supply line is a power supply line and the second supply line is a ground line, wherein a first terminal of a first transistor of the at least two transistors is coupled to the power supply line, wherein a first terminal of a second transistor of the at least two transistors is coupled to the ground line, and wherein a second terminal of the first transistor is coupled to a second terminal of the second transistor to define the protected node.

13. The integrated circuit of claim 12, wherein the first transistor is an NMOS transistor configured to operate in a MOS mode during any electrostatic discharge voltage at the second terminal of the current limiting element with the power supply line coupled to a ground potential.

14. The integrated circuit of claim 12, wherein the second transistor is a PMOS transistor configured to operate in a MOS mode during any electrostatic discharge voltage at the second terminal of the current limiting element with the ground line coupled to a ground potential.

15. The integrated circuit of claim 12, further comprising an input/output pad coupled to the second terminal of the current limiting element.

16. An integrated circuit, comprising:

circuitry coupled to a first supply line, a second supply line and a protected node, the circuitry being susceptible to damage due to an electrostatic discharge event;

a current limiting element having a first terminal coupled to the protected node;

a protection circuit coupled to the first supply line, the second supply line and the protected node, wherein the protection circuit comprises at least two transistors wherein the at least two transistors are configured to be resistant to breakdown during any electrostatic discharge event; and additional circuitry coupled to a second terminal of the current limiting element, wherein the additional circuitry is coupled to a third supply line and a fourth supply line, wherein during operation of the additional circuitry a voltage potential of the third and fourth supply line is different from a voltage potential of the first and second supply line.

* * * * *